United States Patent
Lei et al.

(10) Patent No.: US 10,422,034 B2
(45) Date of Patent: Sep. 24, 2019

(54) SILICON-BASED FILMS AND METHODS OF FORMING THE SAME

(71) Applicant: VERSUM MATERIALS US, LLC, Tempe, AZ (US)

(72) Inventors: Xinjian Lei, Vista, CA (US); Anupama Mallikarjunan, San Marcos, CA (US); Matthew R. MacDonald, Laguna Niguel, CA (US); Manchao Xiao, San Diego, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/848,270

(22) Filed: Dec. 20, 2017

(65) Prior Publication Data

US 2018/0119276 A1 May 3, 2018

Related U.S. Application Data

(62) Division of application No. 14/924,098, filed on Oct. 27, 2015, now Pat. No. 9,879,340.

(60) Provisional application No. 62/074,219, filed on Nov. 3, 2014.

(51) Int. Cl.
| C23C 16/32 | (2006.01) |
| C23C 16/36 | (2006.01) |
| C23C 16/40 | (2006.01) |
| C23C 16/455 | (2006.01) |

(52) U.S. Cl.
CPC ............ *C23C 16/325* (2013.01); *C23C 16/36* (2013.01); *C23C 16/401* (2013.01); *C23C 16/45553* (2013.01)

(58) Field of Classification Search
CPC ...... C23C 16/325; C23C 16/36; C23C 16/401
See application file for complete search history.

(56) References Cited

U.S. PATENT DOCUMENTS

| 4,923,716 A | 5/1990 | Brown et al. |
| 5,744,196 A * | 4/1998 | Laxman ................ C23C 16/402 257/E21.279 |
| 6,448,187 B2 | 9/2002 | Yau et al. |
| 6,743,737 B2 | 6/2004 | Yau et al. |
| 6,858,548 B2 | 2/2005 | Won et al. |
| 7,056,560 B2 | 6/2006 | Yim et al. |
| 7,651,725 B2 | 1/2010 | Yau et al. |
| 7,745,328 B2 | 6/2010 | Yim et al. |
| 7,972,975 B2 | 7/2011 | Dussarrat |
| 8,097,745 B2 * | 1/2012 | Nobe ...................... C07F 7/188 556/466 |
| 8,440,571 B2 | 5/2013 | Weldman et al. |
| 8,575,033 B2 | 11/2013 | Weldman et al. |
| 2003/0139035 A1 | 7/2003 | Yim |
| 2003/0194496 A1 | 10/2003 | Xu et al. |
| 2005/0227017 A1 | 10/2005 | Senzaki |
| 2005/0277302 A1 | 12/2005 | Nguyen et al. |
| 2010/0143609 A1 | 6/2010 | Fukazawa et al. |
| 2010/0233886 A1 * | 9/2010 | Yang ..................... C23C 16/30 438/786 |
| 2011/0082309 A1 | 4/2011 | Nobe |
| 2011/0262642 A1 | 10/2011 | Xao |
| 2011/0275507 A1 | 11/2011 | Dussarrat |
| 2013/0206039 A1 | 8/2013 | Ohhashi |
| 2013/0224964 A1 | 8/2013 | Fukazawa et al. |
| 2014/0030448 A1 | 1/2014 | Bowen et al. |

FOREIGN PATENT DOCUMENTS

| EP | 0721019 A2 | 7/1996 |
| EP | 0848082 A2 | 6/1998 |
| EP | 0723600 | 7/1999 |
| EP | 2692897 A1 | 2/2014 |
| JP | 08274088 | 12/1995 |
| JP | 10203058 | 8/1998 |
| JP | 2002528893 A | 3/2002 |
| JP | 2005513766 A | 12/2005 |
| JP | 2014027285 | 7/2013 |
| WO | 9003452 | 4/1990 |
| WO | 9510638 | 4/1995 |
| WO | 0024050 A1 | 4/2000 |
| WO | 03052162 A1 | 6/2003 |

OTHER PUBLICATIONS

Fracassi, F., et al., "Plasma Deposition of Silicon Nitride-Like thin films from Organosilicon Precursors", Plasmas and Polymers, vol. 1, No. 1, 1996, pp. 3-16.
Bourg, Stephane, et al., "New Stable Titanocene and Zirconocene Catalyst Precursors for Polysilane Synthesis via Dehydrocoupling of Hydrosilanes", Organometallics 1995, 14, pp. 564-566.
Wrobel, A. M., et al., "Reactivity of organosilicon precursors in remote hydrogen microwave plasma chemical vapor desposition of silicon carbide and silicon carhonitride thin-film coatings", Appl. Organometallic Chem., 2010, vol. 24, pp. 201-207.
Wrobel, A. M., et al., "Hard a-SIC:H films formed by remote hydrogen microwave plasma chemical vapor deposition using a novel single-source precursor", Thin Solid Films, Aug. 11, 2012; vol. 520, pp. 7100-7108.
"Extra Low-Temperature SiC Deposition", IPCOM000168604D, Mar. 18, 2008.

(Continued)

Primary Examiner — Pancham Bakshi
(74) Attorney, Agent, or Firm — Joseph D. Rossi

(57) ABSTRACT

Disclosed herein are containing silicon-based films and compositions and methods for forming the same. The silicon-based films contain <50 atomic % of silicon. In one aspect, the silicon-based films have a composition $Si_xC_yN_z$ wherein x is about 0 to about 55, y is about 35 to about 100, and z is about 0 to about 50 atomic weight (wt.) percent (%) as measured by XPS. In another aspect, the silicon-based films were deposited using at least one organosilicon precursor comprising two silicon atoms, at least one Si-Me group, and an ethylene or propylene linkage between the silicon atoms such as 1,4-disilapentane.

12 Claims, No Drawings

(56) References Cited

OTHER PUBLICATIONS

"Method of depositing a thin film on a semiconductor substrate", IPCOM000172513D, Jul. 10, 2008.
Robert J. P. Corriu, et al., "One-Step route to Silicon Carbide Precursors by a Tunable Catalytic Polycondensation", Chem. Mater., 1994, 15-17.
Hubert Schmidbaur, et al., "Darstellung und Charakterisierung einfacher a-Sila- and a,w-Disilaalkane als Vorstufen fur die CVD-Erzeugung von amorphem Silicium a-SiC:H", Z. Naturforsch, 1987, 1088-1096 abstract considered.
L. A. Okada, et al., "Adsorption and decomposition of 1,4-disilabutane ($SiH_3CH_2CH_2SiH_3$) on Si(100) 2z1 and porous silicon surfaces", Surface Science, 1998, 353-366.

\* cited by examiner

SILICON-BASED FILMS AND METHODS OF FORMING THE SAME

CROSS REFERENCE TO RELATED APPLICATIONS

This application is a divisional of U.S. application Ser. No. 14/924,098, filed on Oct. 27, 2015, which, in turn, claims the benefit of priority under 35 U.S.C. § 119(e) to U.S. provisional application No. 62/074,219, filed on Nov. 3, 2014, the disclosures of which are hereby incorporated by reference in their entirety.

BACKGROUND OF THE INVENTION

Disclosed herein are silicon-containing or silicon-based dielectric films or materials, and methods and compositions of forming the same.

The silicon-based dielectric films described herein include, but not limited to, non-stoichiometric silicon carbide, amorphous silicon, silicon carbonitride, or silicon nitride for use in various electronic applications. In certain embodiments, the dielectric films include other elements besides silicon and carbon. These other elements may sometimes be intentionally added into the compositional mixture via the deposition process depending upon the resultant application of the film or desired end-properties.

For example, the element nitrogen (N) may be added to the silicon-based films to form a carbonitride or silicon nitride film to provide a certain dielectric performance such as, without limitation, a lower leakage current. Depending upon the application, however, certain elements in the film may be undesirable even at lower concentration levels.

Silicon carbide films are typically deposited using the precursor 1,4-disilabutane (1,4-DSB). US Publ. No. 2010/0233886 described methods of forming silicon-based films comprising Si, such as, but not limited to, Si oxide, Si oxycarbide, Si carbide, and combinations thereof, that exhibit at least one of the following characteristics: low wet etch resistance, a dielectric constant of 6.0 or below, and/or can withstand a high temperature, rapid thermal anneal process.

While the prior art has disclosed the use of 1,4-disilabutane as precursor for chemical vapor deposition (CVD) of silicon-containing films such as, silicon carbide films with silicon content higher than about 55% according to X-ray photoelectron spectroscopy (XPS), there is a need to deposit silicon carbide films or materials having a silicon content less than about 55%. It is believed that the reason that the SiC films deposited from 1,4-disilabutane had a silicon content greater than >55% Si was because the Si was bound to itself forming Si—Si bonds. These Si—Si bonds make the film susceptible to damage during subsequent process integration steps such as, for example, exposure to $O_2$ plasma treatment or ashing. Hence, there is a need in the art to provide develop alternative precursors and methods using same to provide silicon containing films where the silicon content of the film is less than about 55% as measured by XPS. It is also desirable to have robust films of high density (a density of 2 grams/cubic centimeter (g/cc) or greater) to withstand further processing steps during integration.

BRIEF SUMMARY OF THE INVENTION

The compositions and methods described herein fulfill one or more of the needs in the art. Described herein are methods and precursors for forming silicon-based dielectric materials or films comprising silicon, carbon, optionally nitrogen, and combinations thereof. In certain embodiments, the silicon-based films are substantially free of oxygen, or, alternatively, comprise from about 0 to about 11 atomic weight percent of oxygen as measured by X-ray photoelectron spectroscopy (XPS). In one aspect, the silicon-based films have the composition $Si_xC_yN_z$ wherein x is about 0 to about 55, y is about 35 to about 100, and z is about 0 to about 50 atomic weight (wt.) percent (%) as measured by XPS. In another aspect, the silicon-based films have a composition $Si_xC_y$ wherein x is about 0 to about 55 and y is about 35 to about 100 atomic wt. %. In this or other aspects, the silicon-based films described herein contain about 55 atomic wt. % of silicon or less as measured by X-ray photoelectron spectroscopy (XPS). The atomic wt. % of carbon and optionally nitrogen in the silicon-based films can be tuned by changing deposition conditions such as temperature, adding a nitrogen source, or combinations thereof while maintaining about 55 atomic wt. % of silicon or less in the material or film.

In one aspect, there is provided a method for forming a silicon-based film on at least a portion of the surface of a substrate, the method comprising:

providing the substrate in a reactor;

introducing at least one organosilicon precursor compound having the following Formulae A through D into the reactor:

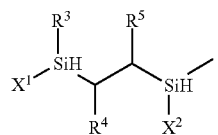

Formula A

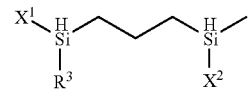

Formula B

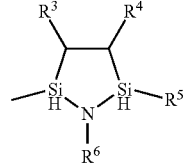

Formula C

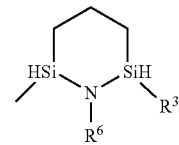

Formula D wherein $X^1$ and $X^2$ are each independently selected from a hydrogen atom, a halide atom, and an organoamino group having the formula $NR^1R^2$ wherein $R^1$ is selected from a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group and $R^2$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group and optionally wherein $R^1$ and $R^2$ are linked together to form a ring selected from a substituted or unsubstituted aromatic ring or a substituted or unsubstituted aliphatic ring; $R^3$, $R^4$, and $R^5$ are each independently selected from a hydrogen atom and a methyl ($CH_3$) group; and $R^6$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; and forming the film on the at least a portion of the surface by a deposition process selected from a group consisting of chemical vapor deposition (CVD), low pressure chemical vapor deposition (LPCVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD) wherein the silicon-based film comprise from about 0 to about 50 atomic weight percent silicon as measured by XPS. In one aspect, the deposition process comprises LPCVD. In another aspect, the deposition process comprises PECVD. Yet, in another aspect, the deposition process comprises PEALD or PECCVD.

In another aspect, there is provided a composition for depositing a silicon-based film; the composition comprising:

at least one organosilicon precursor comprising two silicon atoms selected from the group consisting of 1-chloro-1,4-disilapentane, 1-chloro-1,5-disilahexane, 1,5-dichloro-1,5-disilahexane, 2,6-dichloro-2,6-disilaheptane, 1-dimethylamino-1,4-disilapentane, 1-diethylamino-1,4-disilapentane, 1-di-iso-propylamino-1,4-disilapentane, 1-dimethylamino-1,5-disilahexane, 1-diethylamino-1,5-disilahexane, 1-di-iso-propylamino-1,5-disilahexane, 2-dimethylamino-2,5-disilahexane, 2-diethylamino-2,5-disilahexane, 2-di-iso-propylamino-2,5-disilahexane, 2-dimethylamino-2,6-disilaheptane, 2-diethylamino-2,6-disilaheptane, 2-di-iso-propylamino-2,6-disilaheptane,1,4-bis(dimethylamino)-1,4-disilapentane, 1,4-bis(diethylamino)-1,4-disilapentane, 1,5-bis(dimethylamino)-1,5-disilahexane, 1,5-bis(diethylamino)-1,5-disilahexane, 2,5-bis(dimethylamino)-2,5-disilahexane, 2,5-bis(diethylamino)-2,5-disilahexane, 2,6-bis(dimethylamino)-2,6-disilaheptane, 2,6-bis(diethylamino)-2,6-disilaheptane,1,2-dimethyl-1-aza-2,5-disilacyclopentane, 1-n-propyl-2-methyl-1-aza-2,5-disilacyclopentane, 1-iso-propyl-2-methyl-1-aza-2,5-disilacyclopentane, 1-tert-butyl-2-methyl-1-aza-2,5-disilacyclopentane,1,2-dimethyl-1-aza-2,6-disilacyclohexane, 1-n-propyl-2-methyl-1-aza-2,6-disilacyclohexane, 1-iso-propyl-2-methyl-1-aza-2,6-disilacyclohexane, 1-tert-butyl-2-methyl-1-aza-2,5-disilacyclohexane, 1,2,5-trim ethyl-1-aza-2,5-disilacyclopentane, 1-n-propyl-2,5-dimethyl-1-aza-2,5-disilacyclopentane, 1-iso-propyl-2,5-dimethyl-1-aza-2,5-disilacyclopentane, 1-tert-butyl-2,5-dimethyl-1-aza-2,5-disilacyclopentane, 1,2,6-trimethyl-1-aza-2,6-disilacyclohexane, 1-n-propyl-2,6-dimethyl-1-aza-2,6-disilacyclohexane, 1-iso-propyl-2,6-dimethyl-1-aza-2,6-disilacyclohexane, and 1-tert-butyl-2,6-dimethyl-1-aza-2,6-disilacyclohexane.

DETAILED DESCRIPTION OF THE INVENTION

Described herein are silicon-based dielectric films, and methods and compositions for forming the same. Throughout the description, the term "silicon based film" and "dielectric film" as used herein are interchangeably and refers to a film comprising silicon, carbon and optionally nitrogen and hydrogen (which may be present in the film but not measurable by XPS) selected from the group consisting of stoichiometric or non-stoichiometric silicon carbide, silicon carbonitride, and mixture thereof. In certain embodiments, the silicon-based films are oxygen-free or "substantially free" of oxygen. In these embodiments, the term "substantially free" as used herein means a film that comprises 2 atomic weight % (at. wt. %) or less, or 1 at. wt. % or less, or 0.5 at. wt. 5 or less of oxygen as measured by XPS.

The silicon-based dielectric films exhibit at least one or more of the following characteristics: relatively lower wet etch rate as compared to thermal silicon oxide (such as when exposed to dilute HF); lower leakage current; good within wafer uniformity which uniformity can be obtained by measurement on different areas of the wafers (e.g. 5 point map) and standard deviation calculation; conformality; resistance to gas phase processes (such as, for example, oxidative plasmas); and combinations thereof. With regard to the later characteristics, the silicon-based films exhibits relatively little to no change in properties and film structure compared to thermal silicon oxide. In addition to the foregoing, the silicon-based films provide one or more of the following advantages: high thermal stability (e.g. ability to withstand a spike anneal processing step wherein the subject is subjected to one or more temperatures ranging from about 600 - 1000° C.), environmental stability (e.g. exhibiting little change or 10% or less, 5% or less, 2% or less, or 1% or less change in refractive index (RI) or other film properties after 1-24 hour exposure to ambient), adjustable composition including carbon-rich films (C and/or N doped amorphous silicon-based film with <50 atomic % of Si and carbon content is equal or greater that the Si content), and combinations thereof.

In one particular embodiment, the silicon-based films described herein exhibit a low etch rate (or non measurable etch rate), a high density (e.g., having a film density of 2.0 g/cc or greater), reduced amount of Si—Si bonds (e.g., <5% of total bonding as measured by Raman spectroscopy), and a Si less than 50% atomic wt. % measured by XPS.

In integration processing, photoresist stripping is an indispensable step. The photoresist removal is commonly implemented using an oxygen ($O_2$) plasma dry ashing step. The properties of the silicon-containing dielectric films adjacent to the photoresist may be degraded during the $O_2$ plasma treatment. Common problems that are encountered are one or more of the following: oxidation of the films, loss of carbon, film shrinkage, film densification, and/or increased moisture absorption in the film post stripping. These effects can be measured by one or more of the following: a change in the refractive index (RI) of the film measured by its value before and after ashing; a decreased carbon content as shown by the reduction in C at. wt. % in the film as measured by XPS; a higher dielectric constant (k) value compared to its pre-ashing k value; a higher density measurement compared to its pre-ashing density measurement; and a lower film thickness post-ashing compared to its pre-ashing thickness measurement. It is expected that films of high density (e.g., 2 g/cc or greater) and good Si—C—Si carbide bonding (seen by the peak at ~800 cm-1 in the FTIR spectra) will provide better oxygen ashing resistance.

The silicon-containing dielectric films described herein exhibit + or −20% or less, 15% or less, 10% or less, 5% or less, 2% or less change in one or more of the following characteristics: refractive index, dielectric constant, density, thickness, wet etch resistance, film thickness, or combinations thereof when comparing the same characteristics before or after an oxygen ashing processing step, a temperature spike anneal process, and/or exposure ranging from 1 to 24 hours of ambient air.

The silicon-containing dielectric films described herein are deposited from compositions comprising a organosilicon precursor compound comprising at two silicon atoms, at least one Si-Me group, and an at least one $C_2$ or $C_3$ linkage. The $C_2$ or $C_3$ linkage is a diradical chain selected from the group consisting of an alkane-1,2-diyl, an alkane-1,3-diyl. Examples of alkane-1,2-diyl and alkane-1,3-diyldiradical chains include, but not limited to, ethylene (—$CH_2CH_2$—), substituted ethylene (—CHMeCH$_2$—, —CH(Me)CH(Me)—), propylene (—$CH_2CH_2CH_2$—), and substituted propylene. Examples of the organosilicon compounds include 1,4-disilapentane ("1,4-DSP") and other organosilicon compounds with similar structures. Silicon-based dielectric films deposited from the precursors described herein have shown to have unique film properties over other precursors such as 1-4-disilabutane ("1,4-DSB"), such as being carbon-rich (e.g., have greater than 40 atomic % of C), and the ability to adjust the Si, C content in silicon carbide films or to tune Si, C, and N content in the resultant silicon carbonitride film.

To form dielectric films comprising silicon, carbon, and optionally nitrogen, it is, in certain embodiments, desirable that the organosilicon precursor is free of oxygen. It is also desirable, in certain embodiments, that the precursors be reactive enough to deposit a film at a relatively low temperature (e.g., 600° C. or less). Despite a desire for precursor reactivity, the precursor should also be stable enough to not degrade or change to any significant extent over time (e.g., less than 1% change per year). The organosilicon compounds described herein, such as without limitation 1,4-DSP, with an ethylene or propylene bridge between silicon atoms have special tendency to cleave the C—Si bonds at high temperature. When one silicon group breaks from the ethylene bridge, a free radical or a cation is formed on the bridge-head carbon atom. Another silicon placed on the beta-position provides stabilization to the radical or cation through hyperconjugation, that is, a filled delta-orbital of Si—C bond donates electrons to the empty or single occupancy p-orbital. This is also known as beta-silicon effect. This hyper-conjugated intermediate further decomposes with the breakage of the second Si—C bond. The net result is elimination of ethylene or propylene bridge as volatile byproduct, and generation of chemically reactive silicon species some of which have Si-Me group, consequently reacting with other reactive silicon species to deposit silicon based films on substrate. Not bound by any theory, the Si-Me can be incorporated into the resulting silicon based films, thus providing higher carbon content than comparable films deposited from 1,4-disilabutane which does not have any Si-Me group.

In one aspect, the composition for depositing a dielectric film comprising silicon, carbon, and optionally nitrogen film comprises: at least one organosilicon compound having the following Formulae A through D:

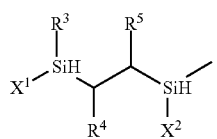

Formula A

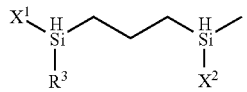

Formula B

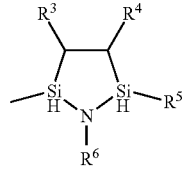

Formula C

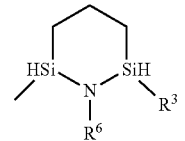

Formula D

In Formulae A-D above, $X^1$ and $X^2$ are each independently selected from a hydrogen atom, a halide atom, and an organoamino group having the formula $NR^1R^2$ wherein $R^1$ is selected from a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group and $R^2$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group and optionally wherein $R^1$ and $R^2$ are linked together to form a ring selected from a substituted or unsubstituted aromatic ring or a substituted or unsubstituted aliphatic ring; $R^3$, $R^4$, and $R^5$ are each independently selected from a hydrogen atom and a methyl ($CH_3$) group; and $R^6$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group.

In the formulae described herein and throughout the description, the term "linear alkyl" denotes a linear functional group having from 1 to 10 or 3 to 6 carbon atoms. Exemplary linear alkyl groups include, but are not limited to, methyl (Me), ethyl (Et), propyl (n-Pr), iso-propyl (iso-Pr or $^i$Pr), butyl (n-Bu), isobutyl ($^i$Bu), sec-butyl ($^s$Bu), tert-butyl ($^t$Bu), pentyl, iso-pentyl, tert-pentyl (amyl), hexyl, iso-hexyl, and neo-hexyl. In the formulae described herein and throughout the description, the term "branched alkyl" denotes a branched functional group having from 3 to 10 or 3 to 6 carbon atoms. Exemplary branched alkyl groups include, but are not limited to, iso-propyl (iso-Pr or $^i$Pr), isobutyl ($^i$Bu), sec-butyl ($^s$Bu), tert-butyl ($^t$Bu), iso-pentyl, tert-pentyl (amyl), iso-hexyl, and neo-hexyl.

In the formulae described herein and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclobutyl, cyclopentyl, cyclohexyl, and cyclooctyl groups.

In the formulae described herein and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In the formulae described herein and throughout the description, the term "alkenyl group" denotes a group which has one or more carbon-carbon double bonds and has from 3 to 10 or from 3 to 6 or from 3 to 4 carbon atoms.

In the formulae described herein and throughout the description, the term "alkynyl group" denotes a group which has one or more carbon-carbon triple bonds and has from 3 to 10 or from 3 to 6 or from 3 to 4 carbon atoms.

In the formulae described herein and throughout the description, the term "dialkylamino group" denotes a group which has two alkyl groups attached to a nitrogen atom and has from 2 to 10 or from 2 to 6 or from 2 to 4 carbon atoms.

In the formulae described herein and throughout the description, the term "electron withdrawing group" as used herein describes an atom or group thereof that acts to draw electrons away from the Si—N bond. Examples of suitable electron withdrawing groups or substituents include, but are not limited to, nitriles (CN). In certain embodiments, electron withdrawing substituent can be adjacent to or proximal to N in any one of Formulae A-D. Further non-limiting examples of an electron withdrawing group includes F, Cl, Br, I, CN, $NO_2$, RSO, and/or $RSO_2$ wherein R can be a $C_1$ to $C_{10}$ alkyl group such as, but not limited to, a methyl group or another group.

In the formulae above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, dialkylamino group, aryl group, and/or electron withdrawing group may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. In other embodiments, one or more of the alkyl group, alkenyl group, alkynyl group, dialkylamino aryl group, and/or electron withdrawing group may be unsubstituted.

In certain embodiments, $R^1$ and $R^2$ in the precursor are the organomino group $NR^1R^2$ and are linked in Formulae A-B to form a ring structure. In these embodiments, $R^2$ is not a hydrogen atom. For example, in an embodiment where $R^1$ and $R^{2\ are}$ linked together to form a ring, $R^2$ has an unsaturated bond (instead of a hydrogen substituent) for linking to $R^1$. Thus, in the example above $R^2$ may be selected from a $C_1$ to $C_{10}$ alkenyl moiety or a linear or branched $C_1$ to $C_{10}$ alkynyl moiety. In these embodiments, the ring structure of the compound can be unsaturated such as, for example, a cyclic alkyl ring, or saturated, for example, an aryl ring. Further, in these embodiments, the ring structure can also be substituted or substituted. In one particular embodiment, the organosilicon compound comprises an aliphatic, substituted ring such as a heteroatomic cyclic functional group having from 5 to 10 carbon atoms and at least one nitrogen atom. Exemplary organomino groups $NR^1R^2$ wherein $R^1$ and $R^2$ are linked in Formulae A-B to form a ring structure include, but are not limited to, 2,6-dimethylpiperidino, piperidino, 2-methyl-pyrrolidino, 2,5-dimethyl-pyrrolidino. In other embodiments, $R^1$ and $R^2$ are not linked in Formulae A-B.

In certain embodiments, the organosilicon precursor compound has Formula A described herein. Exemplary compounds of these particular embodiments include, but are not limited to: 1-chloro-1,4-disilapentane, 1,4-dichloro-1,4-disilapentane, 1-dimethylamino-1,4-disilapentane, 1-diethylamino-1,4-disilapentane, 1-methylethylamino-1,4-disilapentane, 1-di-n-propylamino-1,4-disilapentane, 1-di-iso-propylamino-1,4-disilapentane, 1-iso-propylamino-1,4-disilapentane, 1-sec-butylamino-1,4-disilapentane, 1-tert-butylamino-1,4-disilapentane, 1-(2,6-dimethylpiperidino)-1,4-disilapentane, 1-piperidino-1,4-disilapentane, 1-(cyclohexyl-iso-propylamino)-1,4-disilapentane, 1-(n-propyl-iso-propylamino)-1,4-disilapentane, 1,4-bis(dimethylamino)-1,4-disilapentane, 1,4-bis(diethylamino)-1,4-disilapentane, 1,4-bis(methylethylamino)-1,4-disilapentane, 1,4-bis(di-n-propylamino)-1,4-disilapentane, 1,4-bis(di-iso-propylamino)-1,4-disilapentane, 1,4-bis(iso-propylamino)-1,4-disilapentane, 1,4-bis(sec-butylamino)-1,4-disilapentane, bis(tert-butylamino)-1,4-disilapentane, 1,4-bis(2,6-dimethylpiperidino)-1,4-disilapentane, 1,4-bis(piperidino)-1,4-disilapentane, 1,4-bis(cyclohexyl-iso-propylamino)-1,4-disilapentane, 1,4-bis(n-propyl-iso-propylamino)-1,4-disilapentane,2-chloro-2,5-disilahexane, 2,5-dichloro-disilahexane, 2-dimethylamino-2,5-disilahexane, 2-diethylamino-2,5-disilahexane, 2-methylethylamino-2,5-disilahexane, 2-di-n-propylamino-2,5-disilahexane, 2-di-iso-propylamino-2,5-disilahexane, 2-iso-propylamino-2,5-disilahexane, 2-sec-butylamino-2,5-disilahexane, 2-tert-butylamino-2,5-disilahexane, 2-(2,6-dimethylpiperidino)-2,5-disilahexane, 2-piperidino-2,5-disilahexane, 2-(cyclohexyl-iso-propylamino)-2,5-disilahexane, 2-(n-propyl-iso-propylamino)-2,5-disilahexane, 2,5-bis(dimethylamino)-2,5-disilahexane, 2,5-bis(diethylamino)-2,5-disilahexane, 2,5-bis(methylethylamino)-2,5-disilahexane, 2,5-bis(di-n-propylamino)-2,5-disilahexane, 2,5-bis(di-iso-propylamino)-2,5-disilahexane, 2,5-bis(iso-propylamino)-2,5-disilahexane, 2,5-bis(sec-butylamino)-2,5-disilahexane, 2,5-bis(tert-butylamino)-2,5-disilahexane, 2,5-bis(2,6-dimethylpiperidino)-2,5-disilahexane, 2,5-bis(1-piperidino)-2,5-disilahexane, 2,5-bis(cyclohexyl-iso-propylamino)-2,5-disilahexane, 2,5-bis(n-propyl-iso-propylamino)-2,5-disilahexane, and combinations thereof.

In certain embodiments, the organosilicon precursor compound has Formula B described herein. Exemplary compounds of these particular embodiments include, but are not limited to: 1-chloro-1,5-disilahexane, 1,5-dichloro-1,5-disilahexane, 1-dimethylamino-1,5-disilahexane, 1-diethylamino-1,5-disilahexane, 1-methylethylamino-1,5-disilahexane, 1-di-n-propylamino-1,5-disilahexane, 1-di-iso-propylamino-1,5-disilahexane, 1-iso-propylamino-1,5-disilahexane, 1-sec-butylamino-1,5-disilahexane, 1-tert-butylamino-1,5-disilahexane, 1-(2,6-dimethylpiperidino)-1,5-disilahexane, 1-piperidino-1,5-disilahexane, 1-(cyclohexyl-iso-propylamino)-1,5-disilahexane, 1-(n-propyl-iso-propylamino)-1,5-disilahexane, 1,5-bis(dimethylamino)-1,5-disilahexane, 1,5-bis(diethylamino)-1,5-disilahexane, 1,5-bis(methylethylamino)-1,5-disilahexane, 1,5-bis(di-n-propylamino)-1,5-disilahexane, 1,5-bis(di-iso-propylamino)-1,5-disilahexane, 1,5-bis(iso-propylamino)-1,5-disilahexane, 1,5-bis(sec-butylamino)-1,5-disilahexane, 1,5-bis(tert-butylamino)-1,5-disilahexane, 1,5-bis(2,6-dimethylpiperidino)-1,5-disilahexane, 1,5-bis(1-piperidino)-1,5-disilahexane, 1,5-bis(cyclohexyl-iso-propylamino)-1,5-disilahexane, 1,5-bis(n-propyl-iso-propylamino)-1,5-disilahexane, 2-chloro-2,6-disilaheptane, 2,6-dichlorodisilaheptane, 2-dimethylamino-2,6-disilaheptane, 2-diethylamino-2,6-disilaheptane, 2-methylethylamino-2,6-disilaheptane, 2-di-n-propylamino-2,6-disilaheptane, 2-di-iso-propylamino-2,6-disilaheptane, 2-iso-propylam ino-2,6-disilaheptane, 2-sec-butylamino-2,6-disilaheptane, 2-tert-butylamino-2,6-disilaheptane, 2-(2,6-dimethylpiperidino)-2,6-disilaheptane, 2-piperidino-2,6-disilaheptane, 2-(cyclohexyl-iso-propylamino)-2,6-disilaheptane, 2-(n-propyl-iso-propylamino)-2,6-disilaheptane, 2,6-bis(dimethylamino)-2,6-disilaheptane, 2,6-bis(diethylamino)-2,6-disilaheptane, 2,6-bis(methylethylamino)-2,6-disilaheptane, 2,6-bis(di-n-propylamino)-2,6-disilaheptane, 2,6-bis(di-iso-propylamino)-2,6-disilaheptane, 2,6-bis(iso-propylamino)-2,6-disilaheptane, 2,6-bis(sec-butylamino)-2,6-disilaheptane, 2,6-bis(tert-butylamino)-2,6-disilaheptane, 2,6-bis(2,6-dimethylpiperidino)-2,6-disilaheptane, 2,6-bis(1-piperidino)-2,6-disilaheptane, 2,6-bis(cyclohexyl-iso-propylamino)-2,6-disilaheptane, 2,6-bis(n-propyl-iso-propylamino)-2,6-disilaheptane, and combinations thereof.

In certain embodiments, the organosilicon precursor compound has Formula C described herein. Exemplary compounds of these particular embodiments include, but are not limited to: 1,2-dimethyl-1-aza-2,5-disilacyclopentane, 1-n-propyl-2-methyl-1-aza-2,5-disilacyclopentane, 1-iso-propyl-2-methyl-1-aza-2,5-disilacyclopentane, 1-sec-butyl-2-methyl-1-aza-2,5-disilacyclopentane, 1-tert-butyl-2-methyl-1-aza-2,5-disilacyclopentane, 1,2,5-trimethyl-1-aza-2,5-disilacyclopentane, 1-n-propyl-2,5-dimethyl-1-aza-2,5-disilacyclopentane, 1-iso-propyl-2,5-dimethyl-1-aza-2,5-disilacyclopentane, 1-sec-butyl-2,5-dimethyl-1-aza-2,5-disilacyclopentane, 1-tert-butyl-2,5-dimethyl-1-aza-2,5-disilacyclopentane, and combinations thereof.

In certain embodiments, the organosilicon precursor compound has Formula D described herein. Exemplary compounds of these particular embodiments include, but are not limited to: 2-dimethyl-1-aza-2,6-disilacyclohexane, 1-n-propyl-2-methyl-1-aza-2,6-disilacyclohexane, 1-iso-propyl-2-methyl-1-aza-2,6-disilacyclohexane, 1-sec-butyl-2-methyl-1-aza-2,6-disilacyclohexane, 1-tert-butyl-2-methyl-1-aza-2,6-disilacyclohexane, 1,2,6-trimethyl-1-aza-2,6-disilacyclohexane, 1-n-propyl-2,6-dimethyl-1-aza-2,6-disilacyclohexane, 1-iso-propyl-2,6-dimethyl-1-aza-2,6-disilacyclohexane, 1-sec-butyl-2,6-dimethyl-1-aza-2,6-disilacyclohexane, 1-tert-butyl-2,6-dimethyl-1-aza-2,6-disilacyclohexane, and combinations thereof.

The method used to form the silicon-containing dielectric films are deposition processes. Examples of suitable deposition processes for the method disclosed herein include, but are not limited to, cyclic CVD (CCVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the films are deposited via atomic layer deposition (ALD), plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one aspect, the deposition process comprises LPCVD.

In another aspect, the deposition process comprises PECVD. The term "reactor" as used herein, includes without limitation, reaction chamber or deposition chamber.

In certain embodiments, the method disclosed herein avoids pre-reaction of the precursors by using ALD or CVD methods that separate the precursors prior to and/or during the introduction to the reactor. In this connection, deposition techniques such as ALD or CVD processes are used to deposit the silicon-containing film. In one embodiment, the film is deposited via an ALD process by exposing the substrate surface alternatively to the one or more the silicon-containing precursor, oxygen-containing source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

Depending upon the deposition method, in certain embodiments, the one or more silicon-based precursors may be introduced into the reactor at a predetermined molar volume, or from about 0.1 to about 1000 micromoles. In this or other embodiments, the silicon-based precursor may be introduced into the reactor for a predetermined time period, or from about 0.001 to about 500 seconds.

The deposition methods disclosed herein may involve one or more purge gases. The purge gas, which is used to purge away unconsumed reactants and/or reaction byproducts, is an inert gas that does not react with the precursors. Exemplary inert gases include, but are not limited to, Ar, $N_2$, He, neon, $H_2$ and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

In certain embodiments, the organosilicon precursor is introduced neat, or without additional reactants or carrier gas, under certain deposition conditions to form a solid. In this or other embodiments, a flow of argon, nitrogen, and/or other gas may be employed as a carrier gas to help deliver the vapor of the at least one silicon-based precursor to the reaction chamber during the precursor pulsing.

The at least one silicon precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

The deposition temperature in the reaction chamber ranges from 100° C. to 700° C. Exemplary deposition temperatures include one or more of the following endpoints: 100° C., 150° C., 200° C., 250° C., 300° C., 350° C., 400° C., 450° C., 500° C., 550° C., 600° C., 650° C. and 700° C. Examples of suitable ranges of deposition temperature(s) include without limitation, 100° C. to 400° C., 200° to 450° C., or 300° to 600° C.

In certain embodiments, the pressure during the deposition process within the reaction chamber ranges from about 0.5 to about 10 Torr, or from about 0.5 to about 2 Torr, or from about 0.5 to about 5 Torr. For a PECVD deposition process, the pressure during the deposition process may range from about 2 to about 6 Torr. For a LPCVD deposition process, the pressure during the deposition process may range from about 0.25 is about 1.25 Torr or about 10 Torr.

Energy is applied to the at least one of the precursor, other non-oxygen sources, reducing agent, other precursors or combination thereof to induce reaction and to form the silicon-based film or coating on the substrate. Such energy can be provided by, but not limited to, thermal, plasma, pulsed plasma, helicon plasma, high density plasma, inductively coupled plasma, X-ray, e-beam, photon, and remote plasma methods. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

In a typical ALD, PEALD, CVD or PECCVD process, a substrate such as a silicon oxide substrate is heated on a heater stage in a reaction chamber that is exposed to the precursor initially to allow the complex to chemically adsorb onto the surface of the substrate.

In one aspect, there is provided a method for forming a silicon-based film on at least a portion of the surface of a substrate, the method comprising:

providing the substrate in a reactor;

introducing at least one organosilicon precursor compound having the following Formulae A through D into the reactor:

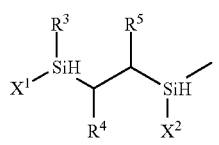

Formula A

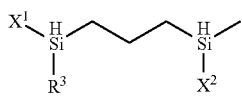

Formula B

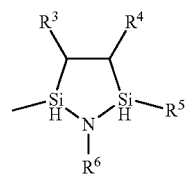

Formula C

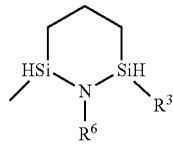

Formula D wherein $X^1$ and $X^2$ are each independently selected from a hydrogen atom, a halide atom, and an organoamino group having the formula $NR^1R^2$ wherein $R^1$ is selected from a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group and $R^2$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $010$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group and optionally wherein $R^1$ and $R^2$ are linked together to form a ring selected from a substituted or unsubstituted aromatic ring or a substituted or unsubstituted aliphatic ring; $R^3$, $R^4$, and $R^5$ are each independently selected from a hydrogen atom and a methyl ($CH_3$) group; and $R^6$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; and forming the film on the at least a portion of the surface by a deposition process selected from a group consisting of chemical vapor deposition (CVD), low pressure chemical vapor deposition (LPCVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD) wherein the silicon-based film comprise from about 0 to about 50 atomic weight percent silicon as measured by XPS. In one aspect, the deposition process comprises LPCVD. In another aspect, the deposition process comprises PECVD.

In another aspect, there is provided a method for forming a silicon-based film having the formula $Si_xC_yN_z$ wherein x is about 0 to 55, y is 35 to 100, and z is 0 to 50 atomic weight (wt.) percent (%) as measured by XPS on at least one surface of a substrate, the method comprising:

providing at least one surface of the substrate in a reaction chamber;

introducing at least one organosilicon precursor compound having the following having the following Formulae A through D into the reactor:

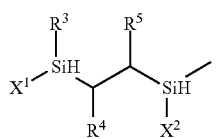

Formula A

-continued

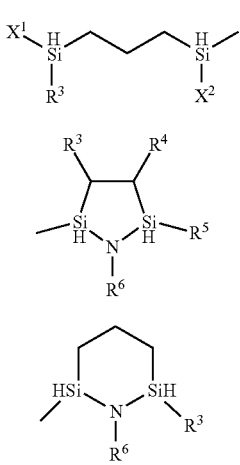

Formula B

Formula C

Formula D wherein $X^1$ and $X^2$ are each independently selected from a hydrogen atom, a halide atom, and an organoamino group having the formula $NR^1R^2$ wherein $R^1$ is selected from a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group and $R^2$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group and optionally wherein $R^1$ and $R^2$ are linked together to form a ring selected from a substituted or unsubstituted aromatic ring or a substituted or unsubstituted aliphatic ring; $R^3$, $R^4$, and $R^5$ are each independently selected from a hydrogen atom and a methyl ($CH_3$) group; and $R^6$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; and optionally introducing a nitrogen-containing precursor selected from the group consisting of ammonia, hydrazine, monoalkylhydrazine, dialkylhydrazine, primary amine, secondary amine, tertiary amine, and mixture thereof in the reaction chamber;

optionally introducing a carbon-containing precursor selected from the group consisting of ethylene, propylene, acetylene, propyne, cyclohexane, cyclooctane and mixture thereof in the reaction chamber; and forming the silicon-based film on the at least one surface by a deposition process comprising low pressure chemical vapor deposition (LPCVD). In certain embodiments, the LPCVD deposition is conducted at one or more temperatures ranging from about 200 to about 600° C. In these or other embodiments, the atomic wt. % of carbon and nitrogen in the silicon-based films can be adjusted by changing the LPCVD deposition conditions such as temperature, adding a nitrogen-containing precursor, or combinations thereof.

In yet another embodiment of the method described herein, a silicon-containing film selected from the group consisting of silicon carbide, silicon nitride and silicon carbonitride, the method comprises:

a. placing a substrate into a reactor which is heated to a one or more temperatures ranging from ambient temperature to about 700° C.;

b. introducing into the reactor at least one organosilicon precursor compound having the following having the following Formulae A through D:

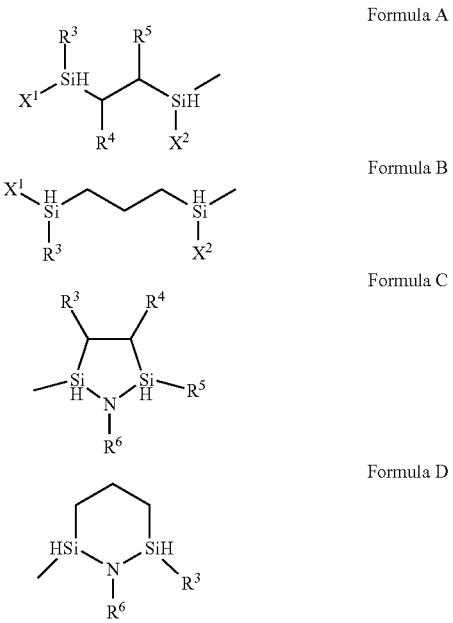

Formula A

Formula B

Formula C

Formula D wherein $X^1$ and $X^2$ are each independently selected from a hydrogen atom, a halide atom, and an organoamino group having the formula $NR^1R^2$ wherein $R^1$ is selected from a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group and $R^2$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group and optionally wherein $R^1$ and $R^2$ are linked together to form a ring selected from a substituted or unsubstituted aromatic ring or a substituted or unsubstituted aliphatic ring; and substituents $R^3$, $R^4$, and $R^5$ are each independently selected from a hydrogen atom and a methyl ($CH_3$) group; and $R^6$ is selected from a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; and c. purging the reactor with a purge gas;

d. providing a plasma containing source into the reactor to at least partially react with the at least one organosilicon precursor compound and deposit the silicon-containing film onto the substrates; and e. purging the reactor with a purge gas.

wherein the steps b through e are repeated until a desired thickness of the silicon containing film is obtained. In some embodiments, the plasma containing source may be introduced into the reactor in the form of at least one nitrogen source and/or may be present incidentally in the other precursors used in the deposition process.

In the method described above, steps b to e defines one cycle and the cycle(s) can be repeated until the desired thickness of a film is obtained. The thickness of the film ranges from about 0.1 Å to about 1000 Å, or from about 0.1 Å to about 100 Å, or from about 0.1 Å to about 10 Å.

In certain embodiments, the silicon containing dielectric film comprises nitrogen. Suitable nitrogen-containing source gases may include, for example, ammonia, hydrazine, monoalkylhydrazine, dialkylhydrazine, primary amine, secondary amine, tertiary amine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, NF3 plasma, organoamine plasma, and mixtures thereof. Exemplary monoalkylhydrazine includes, but not limited, methylhydrazine, tert-butylhydrazine. Exemplary dialkyhydrazine includes, but not limited, 1,1-dimethylhydrazine. Exemplary primary amine includes, but not limited, methylamine, ethylamine, iso-propylamine, and tert-butylamine. Exemplary secondary amine includes, but not limited, dimethylamine, diethylamine, and di-iso-propylamine. Exemplary tertiary amine includes, but not limited, trimethylamine, triethylamine, and pyridine. In one particular embodiment, the nitrogen containing source does not have hydrogen to avoid introducing more hydrogen into the final silicon nitride and is selected from the group consisting of nitrogen plasma, nitrogen/helium, nitrogen/argon plasma, and combinations thereof.

The carbon-containing precursors can be selected from the group consisting of methane, ethane, acetylene, ethylene, propane, propylene, propyne, butane, butylene, butadiene, phenylacetylene, cyclohydrocarbon such as cyclopentane, cyclohexane.

In other embodiments, the plasma is selected from the group consisting of hydrogen plasma, helium plasma, neon plasma, argon plasma, xenon plasma, hydrogen/helium plasma, hydrogen/argon plasma and mixtures thereof. For deposition of silicon carbonitride, the nitrogen containing source can further comprise carbon and is selected from the group consisting of organoamine plasma such as methylamine plasma, dimethylamine plasma, trimethylamine plasma, ethylamine plasma, diethylamine plasma, trimethylamine plasma, and ethylenediamine plasma.

It is understood that the steps of the methods described herein may be performed in a variety of orders, may be performed sequentially or concurrently (e.g., during at least a portion of another step), and any combination thereof. The respective step of supplying the precursors and the other source gases (nitrogen containing source carbon containing source may be performed by varying the duration of the time for supplying them to change the stoichiometric composition of the resulting silicon-based film.

For multi-component silicon-based films, at least one of other precursors such as silicon-based precursors, nitrogen-containing precursors, reducing agents, or other reagents can be alternately introduced into the reactor chamber.

In certain embodiments, the resultant silicon-containing films or coatings can be exposed to a post-deposition treatment such as, but not limited to, a plasma treatment, chemical treatment, ultraviolet light exposure, electron beam exposure, thermal, and/or other treatments to affect one or more properties of the film. In one particular embodiment, the silicon-based film is subjected at a thermal anneal at one or more temperatures ranging from about 500 to about 1000° C. In certain embodiments, the silicon-containing films described herein have a dielectric constant of 10 or less, 9 or less, 7 or less, 6 or less, or 5 or less. However, it is envisioned that films having other dielectric constants (e.g., higher or lower) can be formed depending upon the desired end-use of the film. An example of the silicon containing or silicon-containing film that is formed using the organosilicon precursors and methods described herein has the formulation $Si_xC_yN_z$ wherein Si ranges from about 51% to about 100% or about 55% to about 85%; C ranges from about 0% to about 50% or from about 5% to about 25%; N ranges from about 0% to about 50% or from about 0% to 25% atomic percent weight % wherein x+y+z=100 atomic weight percent, as determined for example, by XPS or other means.

In yet another aspect, there is described a vessel used to store and deliver the organosilicon precursor compound having Formulae A through D described herein. In one particular embodiment, the vessel comprises at least one pressurizable vessel (preferably of stainless steel) fitted with the proper valves and fittings to allow the delivery of the at least one organosilicon precursor to the reactor for a CVD, a LPCVD or an ALD process. In this or other embodiments, the at least one organosilicon precursor having at least two $SiH_3$ groups is provided in a pressurizable vessel comprised of stainless steel and the purity of the precursor is 98% by weight or greater or 99.5% or greater which is suitable for the majority of semiconductor applications. In certain embodiments, such vessels can also have means for mixing the at least one organosilicon precursor with one or more additional precursor if desired. In these or other embodiments, the contents of the vessel(s) can be premixed with an additional precursor. Alternatively, the at least one organosilicon precursor and/or other precursor can be maintained in separate vessels or in a single vessel having separation means for maintaining the organoaminosilane precursor and other precursor separate during storage.

For those embodiments wherein the at least one organosilicon precursor(s) is used in a composition comprising a solvent and an at least one organosilicon precursor described herein, the solvent or mixture thereof selected does not react with the silicon precursor. The amount of solvent by weight percentage in the composition ranges from 0.5% by weight to 99.5% or from 10% by weight to 75%. In this or other embodiments, the solvent has a boiling point (b.p.) similar to the b.p. of the at least one organosilicon or the difference between the b.p. of the solvent and the b.p. of the at least one organosilicon precursor is 40° C. or less, 30° C. or less, or 20° C. or less, or 10° C. or less. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkane (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

As previously mentioned, the purity level of the at least one organosilicon precursor(s) is sufficiently high enough to be acceptable for reliable semiconductor manufacturing. In certain embodiments, the at least one organosilicon described herein comprise less than 2% by weight, or less than 1% by weight, or less than 0.5% by weight of one or more of the following impurities: free amines, free halides or halogen ions, and higher molecular weight species. Higher purity levels of the organosilicon precursor described herein can be obtained through one or more of the following processes: purification, adsorption, and/or distillation. The impurities of the organosilicon precursors having at least two $SiH_3$ groups can be from the raw materials used, solvent used, side-reaction, or by-products. For examples, 1,4-DSP can be prepared via either reduction of 1,1,1,4,4,4-hexachlorodisilabutane or 1,4-alkoxydisilabutane in presence of metal hydride or lithium aluminum tetrahydride in a solvent. In certain embodiments, oxygen-containing solvents such as tetrahydrofuran, gylimes or any other by-products, have to be removed via purification process to eliminate any potential oxygen incorporation into the resulting silicon-based films. In some case, the by-products can be organosilicon compounds which can be used as dopant to deposit silicon-based films.

The films described herein may be suitable for use as passivation layers or sacrificial layers, such as without limitation, etch stop or hermetic barriers. The films described herein can also be used in solid state electronic devices such as logic, memory, light emitting diodes (LEDs), devices planar, patterned, computer chips, optical devices, magnetic information storages, coatings on a supporting material or substrate, microelectromechanical systems (MEMS), nanoelectromechanical systems, thin film transistor (TFT), and liquid crystal displays (LCD).

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The following examples illustrate the method for preparing organosilicon precursors selected from Formulae A-D as well as depositing silicon-containing films described herein and are not intended to limit it in any way.

WORKING EXAMPLES

Example 1

Synthesis of 1-chloro-1,4-disilapentane, 4-chloro-1,4-disilapentane, and 1,4-dichloro-1,4-disilapentane.

The reagents 1,4-disilapentane (0.50 g, 4.8 mmol) and tert-butyl chloride (0.25 g, 2.7 mmol) were combined in the presence of FeCl3 catalyst (less than 0.001 g). After stirring overnight, the reaction mixture was found to contain the following products: 1-chloro-1,4-disilapentane, 4-chloro-1,4-disilapentane, and 1,4-dichloro-1,4-disilapentane among other products by Gas Chromatograph—Mass Spectroscopy (GC-MS) (see Table 1 for mass spectral data).

Example 2

Synthesis of 1-dimethylamino-1,4-disilapentane, 4-dimethylamino-1,4-disilapentane, and 1,4-bis(dimethylamino)-1,4-disilapentane.

A solution of LiNMe2 (0.15 g, 2.9 mmol) in THF (2 mL) was quickly added to 1,4-disilapentane (0.30 g, 2.9 mmol) and stirred overnight. The resulting light grey slurry was filtered and the colorless filtrate was found to contain 1-dimethylamino-1,4-disilapentane, 4-dimethylamino-1,4-disilapentane, and 1,4-bis(dimethylamino)-1,4-disilapentane as major products by GC-MS (see Table 1 for mass spectral data).

Example 3

Synthesis of 1-diethylamino-1,4-disilapentane, 4-diethylamino-1,4-disilapentane, and 1,4-bis(diethylamino)-1,4-disilapentane.

The reagents 1,4-disilapentane (0.22 g, 2.1 mmol) and diethylamine (0.05 g, 0.68 mmol) were combined in the presence of Ca[N(SiMe3)2]2 catalyst (0.01 g, 0.03 mmol). Immediate bubbling was observed. After 4 hours, the reaction solution was probed by GC-MS and found to contain 1-diethylamino-1,4-disilapentane and 4-diethylamino-1,4-disilapentane as major products and 1,4-bis(diethylamino)-1,4-disilapentane as a minor product (see Table 1 for mass spectral data).

Example 4

Synthesis of 1-di-iso-propylamino-1,4-disilapentane and 4-di-iso-propylamino-1,4-disilapentane.

The reagents 1,4-disilapentane (0.16 g, 1.5 mmol) and N-iso-propylidene-iso-propylamine (0.05 g, 0.50 mmol) were combined and added to a stirred mixture of $(Ph_3P)_3$RhCl catalyst (0.02 g, 0.02 mmol) in THF (1 mL). After stirring the reaction overnight, resulting pale orange solution was probed by GC-MS and found to contain 1-di-iso-propylamino-1,4-disilapentane and 4-di-iso-propylamino-1,4-disilapentane as major products (see Table 1 for mass spectral data).

Example 5

Synthesis of 1-tert-butylamino-1,4-disilapentane, 4-tert-butylamino-1,4-disilapentane, and 1-tert-butyl-2-methyl-1-aza-2,5-dislacyclopentane.

The reagents 1,4-disilapentane (0.50 g, 4.8 mmol) and tert-butylamine (0.35 g, 4.8 mmol) were combined in the presence of $Ru_3(CO)_{12}$ catalyst (0.01 g, 0.02 mmol) in THF (1 mL). After stirring the reaction for 3 d, the resulting solution was probed by GC-MS and found to contain 1-tert-butylamino-1,4-disilapentane, 4-tert-butylamino-1,4-disilapentane, and 1-tert-butyl-2-methyl-1-aza-2,5-dislacyclopentane (see Table 1 for mass spectral data).

Additional functionalized organosilicon precursors of Formulae A-D described above were made via similar fashion as Examples 1-5 and were characterized by mass spectroscopy (MS). The molecular weight (MW), the structure, and corresponding major MS fragmentation peaks of each 1,4-disilapentane-based precursor are provided in Table 1 to confirm their identification.

TABLE 1

Organosilicon precursors having Formulae A-D described above.

| No. | Precursor Name | MW | Structure | MS Peaks |
|---|---|---|---|---|
| 1 | 1-chloro-1,4-disilapentane | 138.74 | 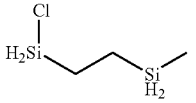 | 137, 123, 108, 95, 79, 72, 62, 58 |
| 2 | 4-chloro-1,4-disilapentane | 138.74 | 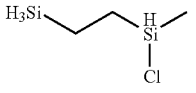 | 137, 123, 109, 92, 79, 73, 65, 58 |
| 3 | 1,4-dichloro-1,4-disilapentane | 173.18 | 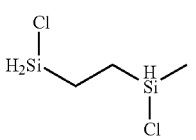 | 171, 157, 144, 129, 107, 92, 79, 63, 58 |
| 4 | 1,4-bis(dimethylamino)-1,4-disilapentane | 190.44 | 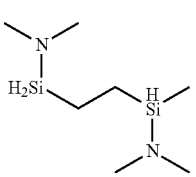 | 189, 173, 158, 146, 130, 117, 100, 86, 74, 59 |
| 5 | 1-diethylamino-1,4-disilapentane | 175.42 | 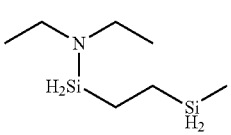 | 175, 160, 144, 130, 116, 103, 86, 72, 59 |
| 6 | 4-diethylamino-1,4-disilapentane | 175.42 | 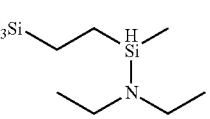 | 175, 160, 144, 130, 116, 103, 88, 72, 58 |
| 7 | 1,4-bis(diethylamino)-1,4-disilapentane | 246.55 | 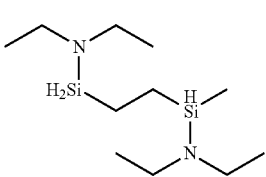 | 246, 231, 217, 201, 187, 174, 160, 144, 130, 116, 100, 86, 72, 58 |
| 8 | 1-di-iso-propylamino-1,4-disilapentane | 203.48 | 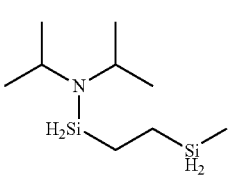 | 203, 188, 172, 158, 144, 130, 116, 103, 86, 75, 59 |
| 9 | 4-di-iso-propylamino-1,4-disilapentane | 203.48 | 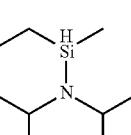 | 203, 188, 172, 158, 144, 130, 116, 103, 88, 75, 59 |
| 10 | 1-tert-butylamino-1,4-disilapentane | 175.42 | 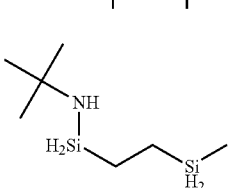 | 175, 160, 144, 118, 103, 88, 75, 57 |

TABLE 1-continued

Organosilicon precursors having Formulae A-D described above.

| No. | Precursor Name | MW | Structure | MS Peaks |
|---|---|---|---|---|
| 11 | 4-tert-butylamino-1,4-disilapentane | 175.42 | | 175, 160, 144, 116, 103, 86, 75, 57 |
| 12 | 1-tert-butyl-2-methyl-1-aza-2,5-dislacyclopentane | 173.41 | | 172, 158, 142, 128, 114, 100, 86, 71, 59 |
| 13 | 1-iso-propylamino-2-methyl-1-aza-2,5-dislacyclopentane | 159.38 | | 159, 144, 128, 114, 103, 86, 70, 59 |
| 14 | 1-di-n-propylamino-1,4-disilapentane | 203.48 | | 203, 174, 158, 144, 130, 116, 103, 75, 59 |
| 15 | 4-di-n-propylamino-1,4-disilapentane | 203.48 | | 203, 174, 158, 144, 130, 116, 103, 75, 58 |
| 16 | 1,4-bis(di-n-propylamino)-1,4-disilapentane | 302.65 | | 302, 273, 260, 229, 202, 188, 174, 158, 130, 116, 100, 86, 72, 58 |
| 17 | 1-di-sec-butylamino-1,4-disilapentane | 231.53 | | 231, 216, 202, 172, 158, 144, 130, 116, 103, 86, 75, 57 |
| 18 | 4-di-sec-butylamino-1,4-disilapentane | 231.53 | | 231, 216, 202, 172, 158, 144, 128, 116, 103, 86, 72, 57 |

TABLE 1-continued

Organosilicon precursors having Formulae A-D described above.

| No. | Precursor Name | MW | Structure | MS Peaks |
|---|---|---|---|---|
| 19 | 1-(2,6-dimethylpiperdino)-1,4-disilapentane | 215.49 | | 215, 200, 184, 168, 156, 144, 130, 116, 103, 86, 75, 55 |
| 20 | 1-(2,6-dimethylpiperdino)-1,4-disilapentane | 215.49 | | 214, 200, 186, 170, 154, 144, 130, 116, 103, 86, 72, 55 |
| 21 | 1,4-bis(2,6-dimethylpiperidino)-1,4-disilapentane | 326.68 | | 326, 311, 295, 253, 212, 200, 184, 170, 157, 140, 130, 116, 103, 86, 72, 55 |
| 22 | 1-cylohexyl-iso-propylamino-1,4-disilapentane | 243.54 | | 243, 228, 212, 200, 184, 172, 158, 144, 130, 116, 103, 86, 75, 55 |
| 23 | 1-cylohexyl-iso-propylamino-1,4-disilapentane | 243.54 | | 243, 228, 200, 172, 158, 144, 130, 116, 103, 86, 75, 55 |
| 24 | 1,4-bis(cyclohexyl-iso-propylamino)-1,4-disilapentane | 382.78 | | 382, 367, 339, 311, 299, 281, 242, 226, 198, 168, 158, 144, 126, 116, 98, 83, 70, 55 |
| 25 | 1-n-propyl-iso-propylamino-1,4-disilapentane | 203.48 | | 203, 188, 174, 158, 144, 130, 116, 103, 86, 75, 58 |

Example 6

Low-Pressure Chemical Vapor Deposition—LPCVD

Using a LPCVD furnace manufactured by ATV Inc. of Germany, silicon-based films were deposited using the precursor 1,4-disilabutane (1,4-DSB) or 1,4-disilapentane (1,4-DSP) either neat or with one or more reactants and/or diluents were deposited at various temperatures. The LPCVD reactor is a horizontal hot wall quartz reactor with 3 independent temperature controlled zones and capable of processing 25 wafers. The precursor (and reactant or diluent gas, if any) is injected into the chamber on one side. Delivery of the precursor into the furnace was through vapor draw and used a mass flow controller (MFC) to meter the vapor flow. Typical flow rate was 20-25 sccm of precursor. Precursor flows were also physically verified by measuring the volume of liquid consumed after the first deposition. Reactor is maintained at a fixed pressure during deposition, 1000 mTorr in this case. All the silicon-containing films were deposited onto medium resistivity (8-12 $\Omega$cm) single crystal silicon wafer substrates. Each deposition consisted of eight (8) test wafers placed in slots 2, slots 10-15, and slot 23 to represent a whole batch in large scale production. The remaining slots were occupied by dummy wafers and baffle wafers (which are not used for measurements). The unreacted material and any byproducts are pumped out using a vacuum pump.

The data for each film deposition was summarized in Tables 2 through Table 4. In the Tables, "ND" means not detected. After the films were deposited, both refractive index and thickness of the dielectric film were measured using a Rudolph FOCUS Ellipsometer FE-IVD (Rotating Compensator Ellipsometer) by fitting the data from the film to a pre-set physical model (e.g., the Lorentz Oscillator model). An SCI Filmtek 2000 SE reflectometer was also used to verify thickness and RI due to the highly absorbing nature of these films. Normal incidence, polarized 70 degree reflection, and 70 degree spectroscopic ellipsometric data is collected and used to calculate thickness and index of refraction of the measured film.

Atomic composition data was collected by XPS performed on a PHI 5000VersaProbe Spectrometer equipped with Multiple Channels Plates (MCD) and a focused Al monochromatic X-ray source. The low resolution survey scan is performed at 117.4 eV Pass Energy, 1.000 eV/Step and a 50 msec/step dwell time. The high resolution multiplex scans are performed at 23.50 eV Pass Energy, 0.100 eV/Step and a 100 msec/step dwell time. The analysis area is 200 microns in diameter with a take-off angle of 45°. The ion gun setting is 2kV/2uA/4×4 raster. The data was collected using vendor supplied software; Casa XPS was used to work up the data using transmission function corrected Area Sensitivity Factors (ASF). Thermally grown $SiO_2$ was used as a reference and did not show any C % or N % to the detection limit of the system.

All density measurements were accomplished using X-ray reflectivity (XRR). Each sample was mounted on the vertically-oriented Materials Research Diffractometer (MRD) wafer holder. XRR was performed using Cu—K radiation as the X-ray source, the automatic Ni beam attenuator, the copper mirror, and the 4-bounce Ge(311) crystal monochromator on the incident beam. The incident beam was also masked down to 10 mm so that the beam footprint would only reflect from the sample. The reflected beam was collimated using triple-axis optics and detected via the gas ionization proportional count detector on the reflected beam. Samples with nominal layer thickness <200 nm were scanned using low-resolution optics. Samples with nominal layer thickness >200 nm were scanned using high-resolution optics. Samples were scanned over the range $0.2000 \leq 2q \leq 0.6500$ using a step size of 0.0010 and a count time of 1 s/step.

Tables 2 and 3 provide the deposition results for the precursors 1,4-disilabutane (1,4-DSB) and 1,4-disilapentane (1,4-DSP), respectively. The deposition results provided in Table 2 were obtained with no reactant being used. As Table 2 shows, good deposition rates are obtained and the high refractive index (RI) of 3 or greater is indicative of high silicon content (RI for crystalline silicon carbide is ~2.8). Table 3 shows deposition results using 1,4-disilapentane (1,4-DSP) under similar conditions. Depositions were done with no reactant; or with $N_2$ or $H_2$ as reactants as indicated. Table 3 shows that good deposition rates are obtained and the refractive index is not indicative of high silicon content.

TABLE 2

Results from depositions using 1,4-disilabutane (1,4-DSB)

| Temp (° C.) | Precursor | Pressure (torr) | Precursor Flow (sccm) | Reactant | Dep Rate (Å/min.) | Refractive Index (632 nm) |
|---|---|---|---|---|---|---|
| 500 | 1,4-DSB | 1 | 25 | None | 6.8 | 3.07 |
| 550 | 1,4-DSB | 1 | 25 | None | 51 | 3.59 |

TABLE 3

Results from depositions using 1,4-disilapentane (1,4-DSP)

| Temp. C. | Precursor | Pressure (torr) | Precursor Flow (sccm) | Reactant | Dep Rate (Å/min.) | Refractive Index (632 nm) |
|---|---|---|---|---|---|---|
| 500 | 1,4-DSP | 1 | 23 | None | 5.0 | 2.32 |
| 550 | 1,4-DSP | 1 | 21 | None | 70 | 2.89 |
| 550 | 1,4-DSP | 1 | 21 | $H_2$ | 75 | 3.04 |
| 550 | 1,4-DSP | 1 | 21 | $N_2$ | 68 | 3.03 |

Table 4 shows details of the film properties for depositions using 1,4-DSP. At 550° C., carbon content of the films was >38% and density was about 2.2 g/cc or greater. The oxygen content in the films could be coming from exposure to ambient air and can be modulated by addition of reactant or diluents. Silicon content was <52% (as measured by XPS).

TABLE 4

Results from depositions using 1,4-disilapentane (1,4-DSP)

| Condition | Temp | Flow (sccm) | Reactant | O % | C % | Si % | Density g/cc |
|---|---|---|---|---|---|---|---|
| 1 | 550 | 21 | N/A | 7.3 | 44.5 | 48.2 | 2.29 |
| 2 | 550 | 21 | 20 sccm $H_2$ | 5.3 | 46.2 | 48.6 | 2.29 |
| 3 | 550 | 21 | 20 sccm $N_2$ | 5.8 | 42.4 | 51.9 | 2.33 |
| 4 | 550 | 23.3 | N/A | 10.7 | 40.5 | 48.7 | 2.20 |
| 5 | 500 | 21 | N/A | 10.8 | 37.2 | 52.1 | 2.16 |

Fourier transform infrared spectroscopy (FTIR) spectra were measured for all samples in Table 4. The spectra generally indicated a strong Si—C—Si peak at ~760 cm-1; a peak at ~1000 cm-1 (assigned to Si—$CH_2$—Si and also Si—O—Si) and a small peak at ~2100 cm-1 (assigned to Si—H). No other bonding was seen. Etch rate was measured by dipping the last two samples in Table 3 in a 0.5% HF solution (1:100 ratio of 49% HF: H₂O) for 300 s. No change in film thickness was measured, showing that the films were resistant to dilute HF etch.

Selected samples from Example 6 (Table 4, condition 1 and 3) were subject to O₂ ashing treatment. The tool is a PVA TePla MetroLine Etcher M4L Plasma Asher Etcher (a batch-mode plasma system for etch, strip, clean, and surface treatment). The recipe was a standard baseline oxygen ashing recipe to remove photoresist.

| Power: | 200 W |
| He flow: | 100 sccm |
| O₂ flow: | 300 sccm |
| Pressure: | 600 mTorr |
| Time: | 10 minutes |

Each sample was split into two pieces: one half was treated with the oxygen ash treatment while the other sample was kept as control. Film properties of all samples were characterized using x-ray photospectroscopy (XPS) and X-ray reflectivity (XRR). Tables 5 and 6 below show the results from two films before and after ashing. No measurable change in film RI was observed. The film thickness showed very minor change, again within experimental error. Similarly there was no obvious change in XPS composition (O, Si, C %) and density change was within experimental error.

TABLE 5

RI and thickness results of 1,4 DSP films pre and post ashing

| Temp | Flow (sccm) | Reactant | Pre ash RI | Pre-ash thickness (nm) | Post ash RI | Post ash thickness (nm) |
| --- | --- | --- | --- | --- | --- | --- |
| 550 | 21 | N/A | 2.61 | 124.1 | 2.61 | 122.6 |
| 550 | 21 | 20 sccm N₂ | 3.12 | 185.7 | 3.15 | 183.1 |

TABLE 6

Composition and density results of 1,4 DSP films pre and post ashing. (Composition was measured after sputtering about 10 nm from surface)

| Temp | Flow (sccm) | Reactant | Pre ash XPS % C | Pre-ash density (g/cc) | Post ash XPS % C | Post ash density (g/cc) |
| --- | --- | --- | --- | --- | --- | --- |
| 550 | 21 | N/A | 39.8 | 2.33 | 39.8 | 2.35 |
| 550 | 21 | 20 sccm N₂ | 39.2 | 2.33 | 39.6 | 2.34 |

The invention claimed is:

1. A method for forming a silicon-based film on at least a portion of the surface of a substrate, the method comprising:
providing at least one surface of the substrate in a reactor;
introducing at least one organosilicon precursor compound having the following Formulae A through D into the reactor:

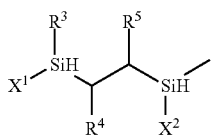

Formula A

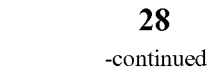

Formula B

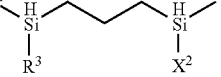

Formula C

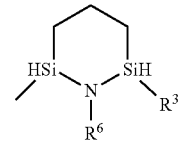

Formula D

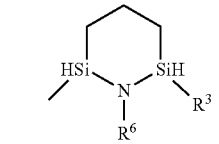

wherein $X^1$ and $X^2$ are each independently selected from the group consisting of a hydrogen atom, and an organoamino group having the formula $NR^1R^2$ wherein $R^1$ is selected from the group consisting of a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group, wherein $X^1$ and $X^2$ cannot both be hydrogen; $R^2$ is selected from the group consisting of a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group and optionally wherein $R^1$ and $R^2$ are linked together to form a ring selected from a substituted or unsubstituted aromatic ring or a substituted or unsubstituted aliphatic ring; $R^3$, $R^4$, and $R^5$ are each independently selected from the group consisting of a hydrogen atom and a methyl ($CH_3$) group; and $R^6$ is selected from the group consisting of a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group; and forming the silicon-based film on the at least one surface by a deposition process selected from the group consisting of chemical vapor deposition (CVD), low pressure chemical vapor deposition (LPCVD), plasma enhanced chemical vapor deposition (PECVD), cyclic chemical vapor deposition (CCVD), plasma enhanced cyclic chemical vapor deposition (PECCVD, atomic layer deposition (ALD), and plasma enhanced atomic layer deposition (PEALD), wherein the silicon-based film comprises from about 0 to about 50 atomic weight percent silicon as measured by X-ray photoelectron spectroscopy (XPS).

2. The method of claim 1 wherein the forming step is conducted at one or more temperatures ranging from about 100° C. to 650° C.

3. The method of claim 1 wherein the silicon-based film is selected from the group consisting of a silicon carbide film, a silicon nitride film, and a silicon carbonitride film.

4. The method of claim 1 wherein the deposition process is LPCVD.

5. The method of claim 1 wherein the deposition process comprises PECVD.

6. The method of claim 1 further comprising: providing a nitrogen-containing precursor and wherein a ratio of the amount of the nitrogen-containing precursor to the amount of at least one organosilicon precursor ranges from 0.25 to 1.

7. A method for forming a silicon-based film on at least one surface of a substrate, the method comprising:
providing at least one surface of the substrate in a reaction chamber;
introducing at least one organosilicon precursor compound having the following Formulae A through D into the reactor:

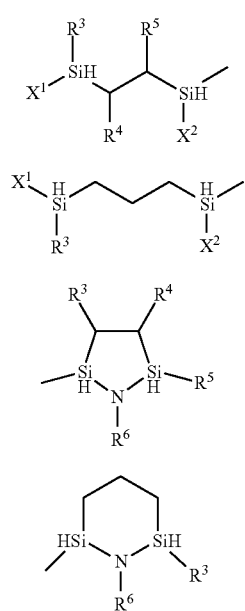

Formula A

Formula B

Formula C

Formula D wherein $X^1$ and $X^2$ are each independently selected from the group consisting of a hydrogen atom, and an organoamino group having the formula $NR^1R^2$ wherein $R^1$ is selected from the group consisting of a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group, wherein $X^1$ and $X^2$ cannot both be hydrogen; $R^2$ is selected from the group consisting of a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, a linear $C_1$ to $C_6$ fluorinated alkyl group, a branched $C_3$ to $C_6$ fluorinated alkyl group, an electron withdrawing group, and a $C_4$ to $C_{10}$ aryl group, and optionally wherein $R^1$ and $R^2$ are linked together to form a ring selected from a substituted or unsubstituted aromatic ring or a substituted or unsubstituted aliphatic ring; $R^3$, $R^4$, and $R^5$ are each independently selected from the group consisting of a hydrogen atom and a methyl ($CH_3$) group; and $R^6$ is selected from the group consisting of a hydrogen atom, a linear $C_1$ to $C_{10}$ alkyl group, a branched $C_3$ to $C_{10}$ alkyl group, a cyclic $C_3$ to $C_{10}$ alkyl group, a linear or branched $C_3$ to $C_{10}$ alkenyl group, a linear or branched $C_3$ to $C_{10}$ alkynyl group, a $C_1$ to $C_6$ dialkylamino group, an electron withdrawing group, and a $C_6$ to $C_{10}$ aryl group;
optionally providing a nitrogen-containing precursor selected from the group consisting of ammonia, hydrazine, monoalkylhydrazine, dialkylhydrazine, primary amine, secondary amine, tertiary amine, and mixture thereof in the reaction chamber; and
forming the silicon-based film on the at least one surface by a deposition process comprising plasma enhanced chemical vapor deposition (PECVD), wherein the silicon-based film comprise from about 0 to about 50 atomic weight percent silicon as measured by XPS.

8. The method of claim 7 wherein the forming step is conducted at one or more temperatures ranging from 100° C. to 650° C.

9. The method of claim 1 wherein the method is an atomic layer deposition method.

10. The method of claim 1 wherein the method is a plasma enhanced atomic layer deposition method.

11. The method of claim 1 wherein the deposition process is PEALD.

12. The method of claim 11 wherein the at least one organosilicon precursor comprises at least one selected from the group consisting of dimethylamino-1,4-disilapentane, 1-diethylamino-1,4-disilapentane, 1-methylethylamino-1,4-disilapentane, 1-di-n-propylamino-1,4-disilapentane, 1-di-iso-propylamino-1,4-disilapentane, 1-iso-propylamino-1,4-disilapentane, 1-sec-butylamino-1,4-disilapentane, 1-tert-butylamino-1,4-disilapentane, 1-(2,6-dimethylpiperidino)-1,4-disilapentane, 1-piperidino-1,4-disilapentane, 1-(cyclohexyl-iso-propylamino)-1,4-disilapentane, and 1-(n-propyl-iso-propylamino)-1,4-disilapentane.

* * * * *